United States Patent
Airoldi

(10) Patent No.: US 10,193,550 B2
(45) Date of Patent: Jan. 29, 2019

(54) INVISIBLE, CONTACTLESS SWITCH DEVICE

(71) Applicant: Roberto Airoldi, St Laurent du Var (FR)

(72) Inventor: Roberto Airoldi, St Laurent du Var (FR)

(73) Assignee: Roberto Airoldi, St Laurent du Var (FR)

( * ) Notice: Subject to any disclaimer, the term of this patent is extended or adjusted under 35 U.S.C. 154(b) by 0 days.

(21) Appl. No.: 15/109,909

(22) PCT Filed: Jan. 7, 2015

(86) PCT No.: PCT/FR2015/000007
§ 371 (c)(1),
(2) Date: Jul. 6, 2016

(87) PCT Pub. No.: WO2015/104480
PCT Pub. Date: Jul. 16, 2015

(65) Prior Publication Data
US 2016/0329893 A1    Nov. 10, 2016

(30) Foreign Application Priority Data

Jan. 9, 2014   (EP) ................................. 14305028

(51) Int. Cl.
*H01H 47/00*     (2006.01)
*H01H 83/00*     (2006.01)
(Continued)

(52) U.S. Cl.
CPC ........... *H03K 17/955* (2013.01); *G01R 27/26* (2013.01); *H03K 17/94* (2013.01); *H01Q 1/38* (2013.01);
(Continued)

(58) Field of Classification Search
CPC ........ G01R 27/26; G01R 27/28; G01N 27/22; H03K 17/94; H03K 17/96; H01Q 5/00;
(Continued)

(56) References Cited

U.S. PATENT DOCUMENTS

| 5,398,041 A * | 3/1995 | Hyatt ................... B60R 16/0373 345/88 |
| 2003/0080755 A1* | 5/2003 | Kobayashi ........... G01D 5/2405 324/658 |

(Continued)

FOREIGN PATENT DOCUMENTS

| AU | 2013205636 | 5/2013 |
| DE | 19946858 | 4/2001 |

(Continued)

*Primary Examiner* — Fritz M Fleming
*Assistant Examiner* — Jagdeep Dhillon
(74) *Attorney, Agent, or Firm* — James C. Lydon

(57) ABSTRACT

A switching device adapted to be installed behind an opaque wall (32) so as not to be visible from the outside of the wall and intended to switch at least one electrical device (44) on. This switching device includes a first module (10) and a second module (12) adapted to make the connection between the device and a power source. The first module includes a capacitive sensor (16) having a capacitor on a printed circuit board adapted to change its capacitance value when the hand (34) of a user on the outside is placed near the wall where the device is installed. The capacitor is included in a metal frame whose function is to define the capacitive field due to the capacitor in the plane of the board and to maximize this field perpendicular to the plane of the board.

9 Claims, 3 Drawing Sheets

(51) Int. Cl.
  *H02J 7/00* (2006.01)
  *H03K 17/955* (2006.01)
  *H03K 17/94* (2006.01)
  *G01R 27/26* (2006.01)
  *H01Q 1/38* (2006.01)

(52) U.S. Cl.
  CPC .............. *H03K 2217/94089* (2013.01); *H03K 2217/960765* (2013.01)

(58) Field of Classification Search
  CPC ..... H02M 3/335; H02M 3/337; G06F 3/0354; G06F 3/045
  USPC .............. 307/125, 66, 64, 82; 320/107, 108; 363/21.12, 21.14; 324/663, 664, 686; 343/702; 341/33
  See application file for complete search history.

(56) References Cited

U.S. PATENT DOCUMENTS

| | | | |
|---|---|---|---|
| 2003/0193417 A1 | 10/2003 | Face et al. | |
| 2010/0283485 A1* | 11/2010 | Valisuo | G01D 5/24 324/663 |
| 2011/0121654 A1* | 5/2011 | Recker | H02J 9/065 307/66 |
| 2011/0140935 A1* | 6/2011 | Anorozo | H03K 17/962 341/33 |
| 2012/0013354 A1* | 1/2012 | Bowler | G01N 27/226 324/664 |
| 2012/0092350 A1* | 4/2012 | Ganapathi | G02B 26/0833 345/501 |
| 2013/0107486 A1* | 5/2013 | Hiralal | H01G 11/14 361/782 |
| 2014/0002405 A1* | 1/2014 | Salter | H03K 17/962 345/174 |
| 2014/0252201 A1* | 9/2014 | Li | H01L 27/14616 250/208.1 |
| 2014/0253032 A1* | 9/2014 | Bruwer | H02M 1/36 320/108 |
| 2014/0340265 A1* | 11/2014 | Vazquez | H01Q 9/42 343/702 |
| 2015/0123932 A1* | 5/2015 | Collins | G06F 3/03545 345/174 |

FOREIGN PATENT DOCUMENTS

| | | |
|---|---|---|
| DE | 202011100961 | 8/2011 |
| EP | 1965494 | 9/2008 |

* cited by examiner

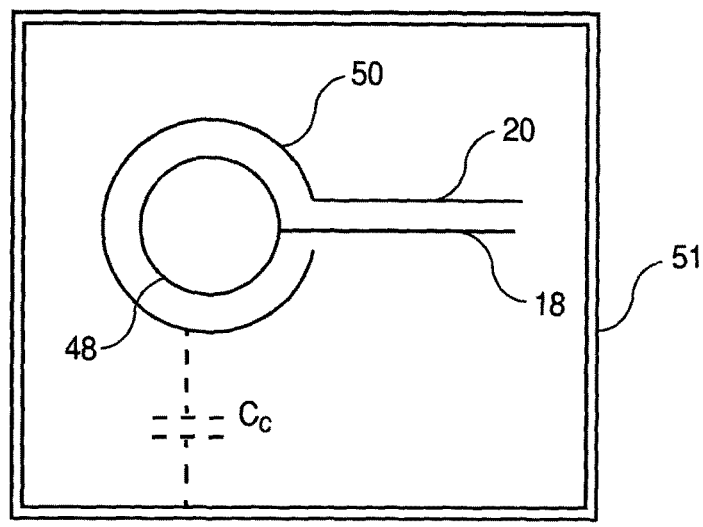
FIG. 2
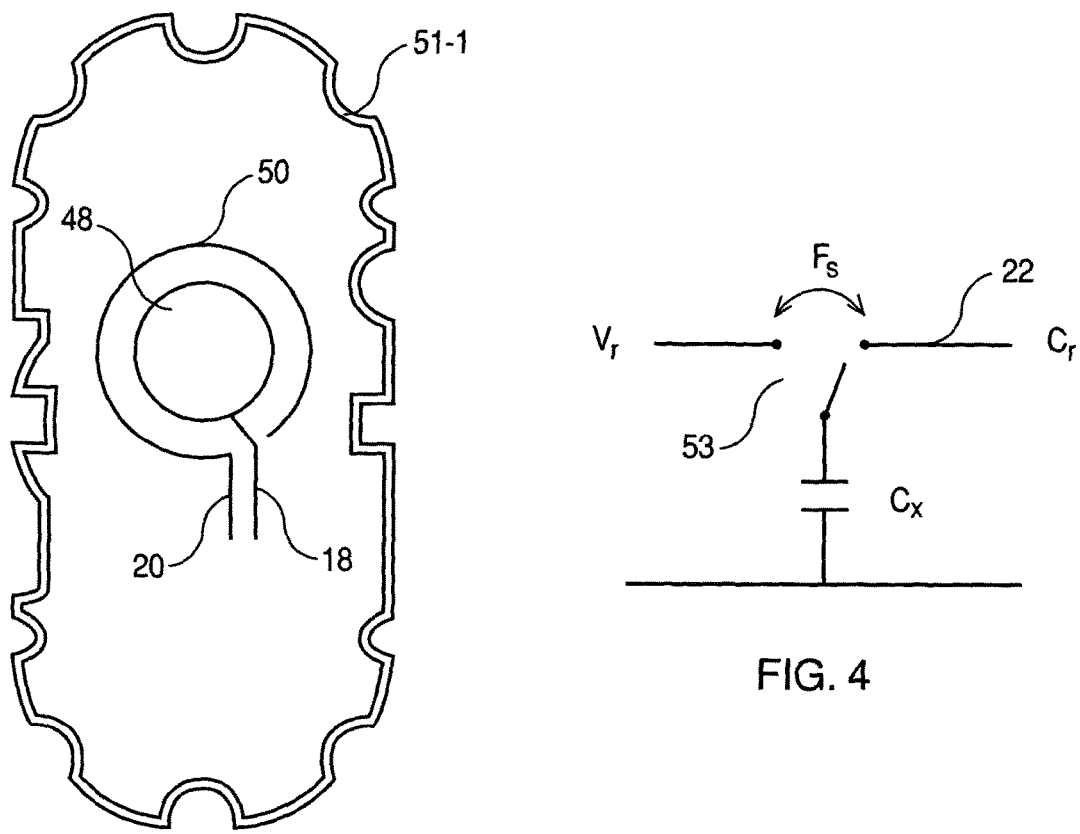
FIG. 3
FIG. 4

# INVISIBLE, CONTACTLESS SWITCH DEVICE

TECHNICAL FIELD

The present invention relates to switching all kinds of electrical devices on or off, including lighting devices in healthcare establishments, and particularly relates to an invisible and contactless switching device.

PRIOR ART

Switching electrical devices on or off is usually performed by means of electromechanical switching devices such as buttons, switches or levers generally connected to electrical devices by means of wiring.

However, these switching devices do not meet the necessary hygiene conditions and can lead to the transmission of contagious diseases. This drawback is particularly relevant in the hospital environment where it may lead to the spread of nosocomial infections. Furthermore, the repeated handling of these devices results in their rapid, visually apparent deterioration as well as in the wear of the parts comprising the device, and leading to their malfunction.

The problems cited have been partly solved through the use of switching devices that do not require the user to touch the device in order to switch on or off, as the operation is carried out by means of a capacitive sensor. Such a connection device is described in the document AU 2013205636. In this document, however, the device is visible since the wall behind which the device is located includes a transparent window. This transparency is necessary in order for the system to operate efficiently owing to the fact that the capacitive sensor would not fulfil its role without this window. Furthermore, this is supported as it is specified in the document that, in order for capacitive sensing to occur, the object must be placed in front of the sensor for a long period of time.

DISCLOSURE OF THE INVENTION

The main purpose of the present invention is thus to provide a switching device comprising a capacitive sensor that is placed behind a wall of any material whatsoever and which is activated by the hand of the user without the latter touching the wall.

A first object of the invention is thus an invisible and contactless switching device adapted to be installed behind an opaque wall so as not to be visible from the outside of the wall and intended to switch at least one electrical device on, and comprising at least a first module and a second module adapted to make the connection between the electrical device and a power source, the first module comprising a capacitive sensor adapted to change its capacitance value when the hand or any other part of the body of a user on the outside is placed near the wall in the location where the device is installed. The device is characterised in that the capacitive sensor, which is located on a printed circuit type board comprises a capacitor having a first metal electrode consisting of a solid circle and a second metal electrode surrounding the first electrode which is concentric with it, both electrodes being included in a metal frame whose function is to define the capacitive field due to the capacitor formed by the two electrodes in the plane of the board and to maximize this field perpendicular to the plane of the board.

A second object of the invention is a switching device comprising a plurality of modules identical to the first module mentioned above which communicate by means of a communication means with a second module identical to the second module mentioned above, adapted to switch at least one electrical device on or off by means of switches controlled by a microcontroller.

BRIEF DESCRIPTION OF FIGURES

Other purposes, objects and characteristics of the invention will become more apparent from the following description when taken in conjunction with the accompanying drawings in which:

FIG. 2 schematically shows a capacitive sensor characterising the switching device according to the invention;

FIG. 3 schematically shows another capacitive sensor characterising the switching device according to the invention;

FIG. 4 is a schematic representation of the charging of the reference capacitor.

DETAILED DESCRIPTION OF THE INVENTION

Figure 1:
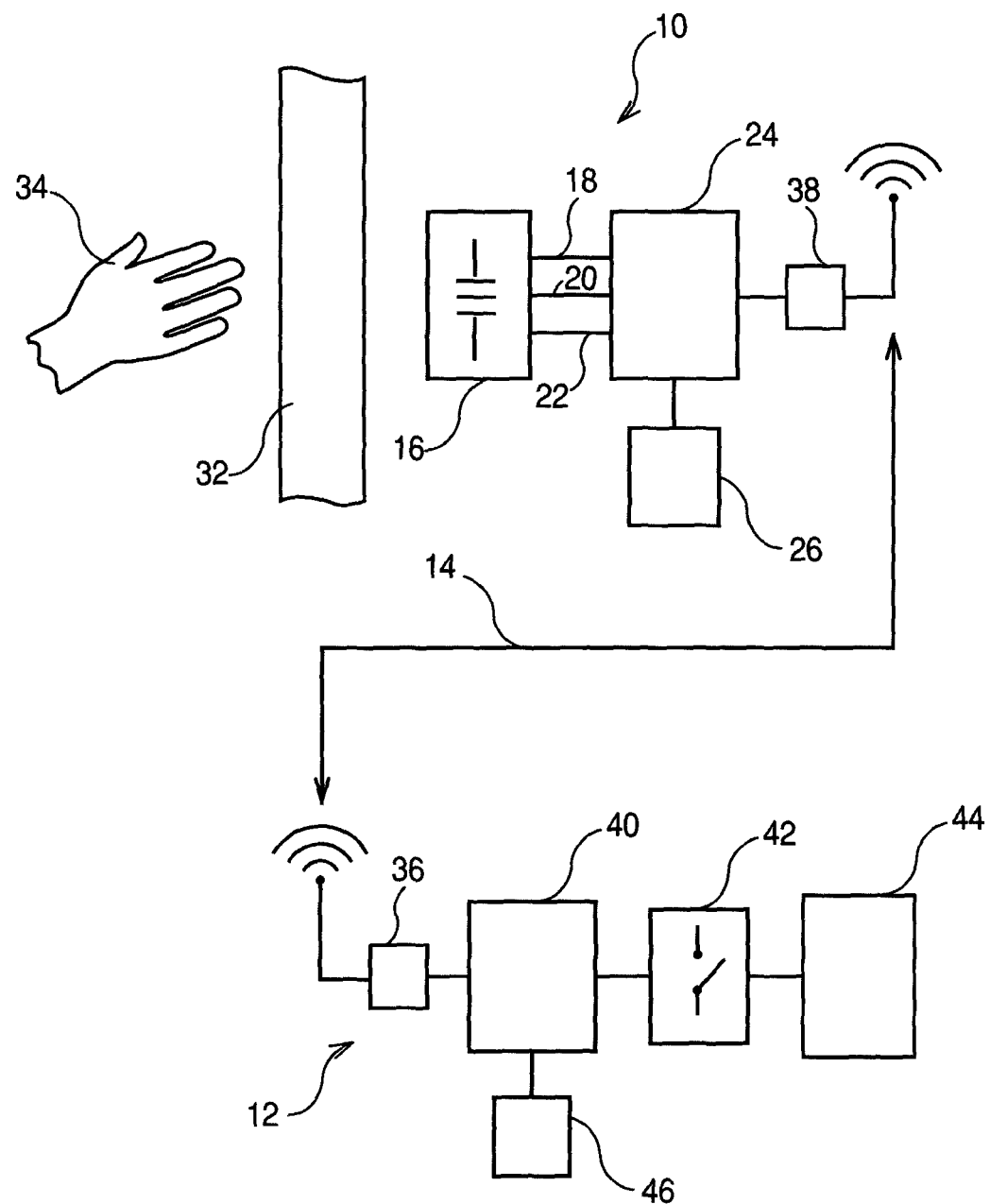
FIG. 1 is a block diagram representing an embodiment of the switching device according to the invention.

The switching device according to the invention shown in FIG. 1 comprises a first module 10, a second module 12 and a communication means 14 which enables the first module 10 to communicate with the second module 12.

The module 10 comprises a capacitive sensor 16 connected by the outputs 18, 20 and 22 to a microcontroller 24.

The power source 26, a rechargeable battery, a battery, a photovoltaic cell or an AC/DC converter, supplies the electric power needed to operate the microcontroller 24.

As previously mentioned, the first module 10 is placed behind a wall 32 such as a partition or a wall. This wall is made of any material such as wood, concrete or even metal such as copper. The first module 10 is activated when an operator extends his/her hand 34, or any other part of the body near the wall 32, to a distance between 2 cm and 5 cm.

The second module 12, which is connected to the first module by the communication means 14, comprises a receiver 36 adapted to receive instructions transmitted by the microcontroller 24 via a transmitter 38 of the first module. The receiver 36 is connected to a second microcontroller 40 adapted to translate the instructions received from the first module and particularly to act on a switch 42 adapted to control the connection of an electrical device 44 to its electrical power source when the instruction received from the first module contains this order. It should be noted that, according to a variant of the invention, the receiver may include a microcontroller adapted to translate the instructions received. In this variant, the microcontroller 40 is no longer necessary.

A power source 46 such as a rechargeable battery, a battery, a photovoltaic cell or the power grid, supplies the electric power required to operate the microcontroller 40, but may also supply the electric power to the electrical device 44.

According to a preferred embodiment of the invention, the communication means 14 is a wireless link wherein the transmitter 38 is a radio transmitter and the receiver 36 is a radio receiver as shown schematically in FIG. 1. In this case, in the first module, the electrical power source 26 is also used as a power source for the transmitter 38. The same is true concerning the power source 46 of the second module, which is also used as a power source of the receiver 36. It should be noted that, because the capacitive sensor 16 consumes very little and that the wireless link is activated only briefly, the power source to be installed in the first module is very small in size and easily integrated into the case containing the module. As far as the power source of the second module is concerned, it may be integrated in the electrical device 44 or in its immediate vicinity, for example in the suspended ceiling, if the electrical device is a ceiling light fixture.

In a variant of the wireless embodiment, an option consists in using transmitter/receivers, referred to as "transceivers", as transmitter 38 and receiver 36, which allow the communication to be secured by well-known asynchronous data acquisition techniques, automatic retry in case of failure, etc.

Furthermore, the wireless embodiment is interesting insofar as it considerably reduces the amount of wiring required and especially offers significant flexibility for the positioning of the devices controlled. In addition, a change in configuration is possible without work since the various components can be easily and freely associated or dissociated.

In reference to FIG. 2, the capacitive sensor 16 is located on a printed circuit type board and includes a first electrode 48 and a second electrode 50. In the preferred embodiment, the first electrode 48 is a solid circle made of metal, generally copper, having a diameter of approximately 2 cm. The second electrode 50 is a metal wire, preferably copper, surrounding the first electrode and concentric thereto. The two electrodes are connected to the microcontroller 24 via the outputs 18 and 20. Both electrodes are located inside a metal frame 51, preferably made of copper. The frame 51 is designed to define the capacitive field due to the capacitor formed by the two electrodes in the plane of the board and to maximise this field perpendicular to the plane of the board so that this field is disrupted when the hand 34 is extended near the wall 32. With due regard to the frame 51 and the environment, the capacitor formed by the two electrodes 48 and 50 has a capacitance value $C_x$ generally between 10 pF and 25 pF.

When an operator or any person wishes to operate the electrical device 44, he/she extends his/her hand 34 or any other part of the body in front of the wall 32, behind which has been placed the first module 10, to a distance between 2 cm and 5 cm from the wall. This has the effect of introducing a capacitor $C_c$ between the electrode 50 and the frame 51. As a result, the capacitance value of the capacitor, detected by the microcontroller 16 on the outputs 18 and 20, changes, which allows the microcontroller 16 to send a control signal on the communication means 14.

As previously mentioned, the frame surrounding the capacitive sensor is very relevant. It may be non-rectangular in shape as the frame 51-1, which is shown in FIG. 3. It is therefore judicious to determine the shape of this frame as precisely as possible through experience and know-how.

FIG. 4 shows the means used to detect the hand 34 in front of the wall 32. As can be seen, a switch 53 is connected to the output 18 of the capacitor $C_x$ and makes contact at a switching frequency $F_s$ alternately with a voltage $V_r$ and a reference capacitor $C_r$ on the output 22. This frequency, also referred to as charge transfer frequency, of approximately 100 kHz, allows the capacitor $C_x$ to be charged from the voltage $V_r$ and the capacitor $C_r$ to be charged from the capacitor $C_x$ until the capacitance value reached, which corresponds to the reference voltage $V_r$, is approximately 35 nF. Assuming that $N_r$ contacts of the switch 53 are required with the output 22 to reach the desired capacitance value of the reference capacitor Cr, it therefore has a value equal to $N_r \cdot C_x$.

When the hand 34 approaches the wall 32, it introduces a capacitor $C_c$ with a capacitance value of approximately 0.3 pF and thus decreases the number $N_r$ of contacts required to reach the value $C_r$. The microcontroller 24 thus detects a lower number $N_r$ and sends an instruction via the communication means 14 to control the connection of the electrical device 44.

Figure 5:
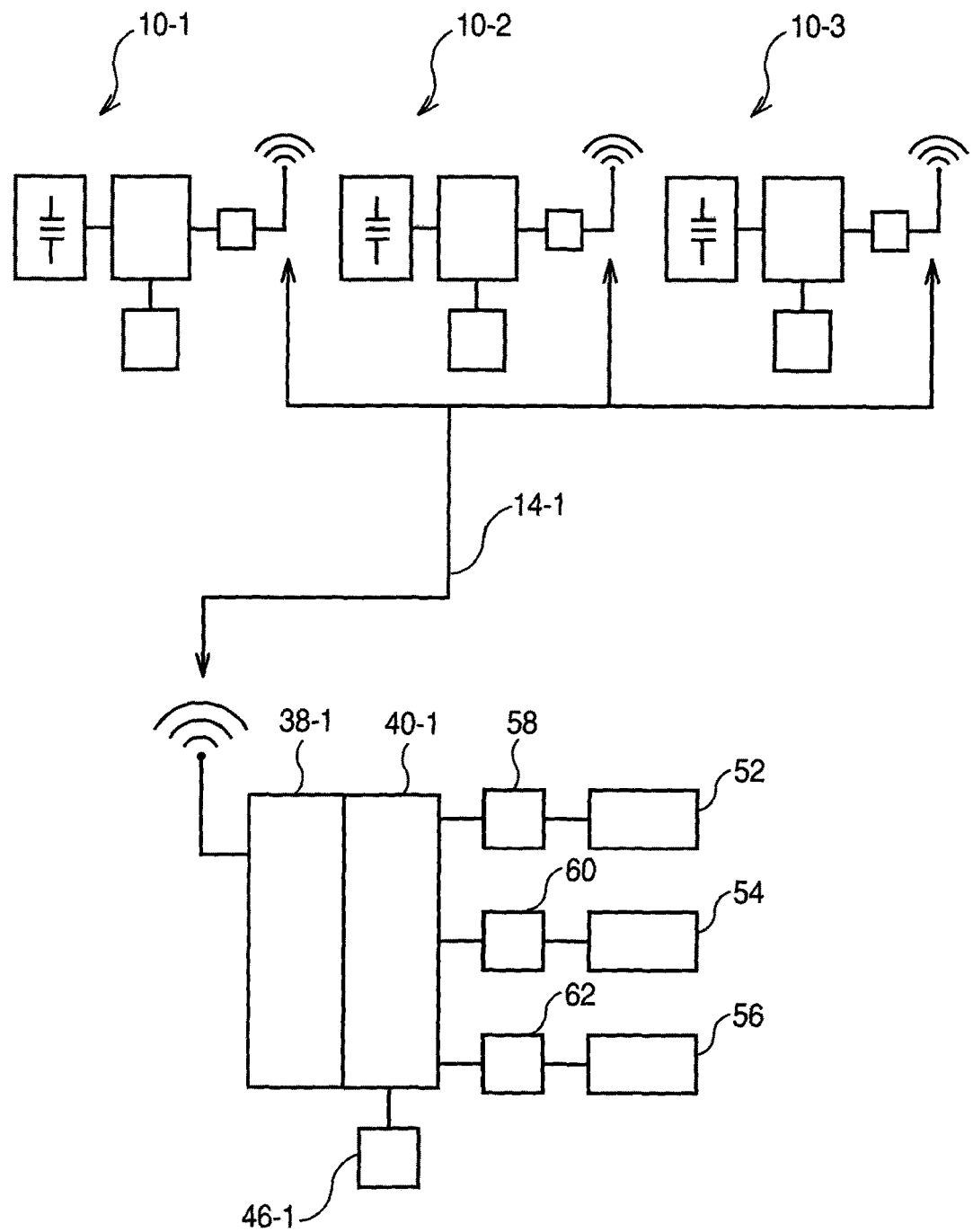
FIG. 5 is a block diagram representing an embodiment of the switching device according to the invention comprising a plurality of modules and at least one electrical device.

In reference to FIG. 5, the device according to the invention comprises a plurality of modules identical to the first module of FIG. 1, here three modules 10-1, 10-2 and 10-3, which communicate with the second module through the communication means 14-1. In particular, each of the first modules 10-1, 10-2 and 10-3 comprises a capacitive sensor adapted to detect the presence of the hand of a user.

The second module of FIG. 5 comprises three electrical devices 52, 54 and 56 which are switched on or off by the switches 58, 60 and 62, respectively. These switches are controlled by a second microcontroller 40-1 similar to the microcontroller 40 of FIG. 1 which receives its instructions from one of the first modules 10-1, 10-2 or 10-3. The electric power to the components of the module and in particular of the microcontroller 40-1 and the electric devices is supplied by the power source 46-1, generally a rechargeable battery. It should be noted that there may be only one single electrical device while there are several first modules, and thus several capacitive sensors.

To illustrate the embodiment of FIG. 5, the switching device, which comprises a plurality of first modules each having a capacitive sensor, may be used in an augmented "man-machine" interface context. Thus, such a device can be used as a light dimmer for which an access point has two modules, thus two capacitive sensors placed above one another in a decoration having a downward arrow accompanied by a minus sign and an upward arrow accompanied by a plus sign. When the light fixture is off or when the light fixtures are off, in the case of several light fixtures, extending one's hand toward either of the detectors will switch on the lighting as described above. The action of waving the hand in an upward motion over the location of the detectors will increase the light intensity. If the motion is paused at that moment, the intensity of the light continues to increase as long as this proximity is maintained, and until the maximum light intensity is reached. Conversely, the light intensity may be reduced by waving the hand in a downward motion. Of course, what has just been said can be extended to more than two associated devices.

The instructions from one of the microcontrollers of the modules 10-1, 10-2 or 10-3, particularly control instructions from one of the switches 58, 60 or 62 to switch one of the electrical devices 52, 54 or 56 on or off, are received by the receiver 38-1 that transmits them to the microcontroller 40-1. Thus, the extension of the hand of the operator in front of the wall, where one of the modules 10-1, 10-2 or 10-3 is located, results in the transmission of instructions to switch an electrical device 52, 54 or 56 on or off, respectively.

The switching device according to the invention described above has many advantages. Actually, it can replace all kinds of electromechanical switches usually used for lighting, heating and door opening devices, etc. This is particularly useful in public establishments to prevent the public from touching the switch and thus causing its degradation. The public establishments where the switching device according to the invention is well suited are hospitals where contacts are to be avoided at all costs so as not to transmit nosocomial diseases.

A significant advantage is that the device is placed behind a wall and thus cannot be seen and does not project from the wall as a conventional switch. Furthermore, the wall which is, generally speaking, a wall or a partition of a few centimeters thick, may be made, in whole or in part, of any material such as wood, concrete or even metal. The position of the device can be identified by a discrete marking which may be a label, a printed mark, engraving or other marking means.

The fact that the wall, behind which the device is located, may be made of metal is a considerable advantage in the hospital environment. Actually, it has been known for a long time that copper is an antibacterial metal. Hospitals therefore now install copper coverings on the walls. Therefore, devices according to the invention may easily be placed behind partitions in hospitals having such copper coatings as a replacement for conventional switches.

The invention claimed is:

1. A switching device adapted to be installed behind an opaque wall so as not to be visible from the outside of said wall and intended to switch at least one electrical device on and comprising at least a first module connected by a wireless link or a wired link to a second module adapted to make the connection between said electrical device and a power source, said first module comprising a capacitive sensor adapted to change its capacitance value when the hand or any other part of the body of a user on the outside is placed near the wall where said switching device is installed, said switching device being characterized in that the capacitive sensor, which is located on a printed circuit board comprises a capacitor $C_x$ having a first metal electrode consisting of a solid circle and a second metal electrode surrounding said first electrode and being concentric with it, both electrodes being included in a metal frame, whose function is to define the capacitive field resulting from the capacitor formed by the two electrodes in the plane of the board and to maximize this field perpendicular to the plane of the board, wherein said capacitive sensor contains a circuit for calculating the number of times $N_r$ a reference voltage $V_r$ must be applied to said capacitor $C_x$ so that it can charge a reference capacitor $C_r$ to a predetermined value, and wherein said first module comprises a first microcontroller adapted to transmit instructions to a second microcontroller in said second module intended to control the connection of said electrical device to its electrical power source when said reference number $N_r$ has been reduced due to a parasitic capacitor $C_c$ caused by the approach of the hand of the user is added in parallel to said reference capacitor $C_r$.

2. The device according to claim 1, wherein said capacitor $C_x$ has a capacitance value between 10 pF and 25 pF.

3. The device according to claim 2, wherein said capacitor $C_r$ has a capacitance value of approximately 35 nF.

4. The device according to claim 1, wherein said capacitor $C_r$ has a capacitance value of approximately 0.3 pF.

5. The device according to claim 1, wherein said wireless link is between a radio transmitter in said first module and a radio receiver in said second module.

6. The device according to claim 1, comprising a plurality of modules identical to said first module each having a capacitive sensor, which communicate with a second module through a wireless link or a wired link, said second module being adapted to switch at least one electrical device on or off by means of switches controlled by a second microcontroller.

7. The device according to claim 6, wherein said plurality of modules is used as a light dimmer by passing the hand in an upward motion in front of said wall so as to activate at least two capacitive sensors to increase the light intensity, and in a downward motion to decrease the light intensity.

8. The device according to claim 1, wherein said wall is made of metal.

9. The device according to claim 8, wherein said metal is copper.

* * * * *